US009159415B2

(12) United States Patent
Cosemans

(10) Patent No.: US 9,159,415 B2
(45) Date of Patent: Oct. 13, 2015

(54) NON-VOLATILE RESISTIVE MEMORY DEVICES AND METHODS FOR BIASING RESISTIVE MEMORY STRUCTURES THEREOF

(71) Applicant: IMEC, Leuven (BE)

(72) Inventor: Stefan Cosemans, Mol (BE)

(73) Assignee: IMEC, Leuven (BE)

(*) Notice: Subject to any disclaimer, the term of this patent is extended or adjusted under 35 U.S.C. 154(b) by 0 days.

(21) Appl. No.: 14/039,932

(22) Filed: Sep. 27, 2013

(65) Prior Publication Data
US 2014/0092670 A1  Apr. 3, 2014

(30) Foreign Application Priority Data
Sep. 28, 2012 (EP) ................................. 12186669

(51) Int. Cl.
G11C 13/00 (2006.01)
H01L 27/24 (2006.01)
(Continued)

(52) U.S. Cl.
CPC .......... G11C 13/0069 (2013.01); G11C 13/003 (2013.01); G11C 13/0007 (2013.01); G11C 13/0097 (2013.01); H01L 27/2436 (2013.01); H01L 27/2463 (2013.01); G11C 11/1659 (2013.01); G11C 11/1675 (2013.01); G11C 2013/0073 (2013.01); G11C 2013/0083 (2013.01); G11C 2013/0088 (2013.01); G11C 2213/79 (2013.01); H01L 45/08 (2013.01); H01L 45/1233 (2013.01); H01L 45/146 (2013.01)

(58) Field of Classification Search
CPC .................................................. G11C 13/0069
USPC ........................................................... 365/148
See application file for complete search history.

(56) References Cited

U.S. PATENT DOCUMENTS 6,404,668 B2 * 6/2002 Kowarik et al. ............... 365/145
7,933,139 B2 * 4/2011 Lung ............................. 365/148
8,363,451 B2 * 1/2013 Rao ............................... 365/148
(Continued)

FOREIGN PATENT DOCUMENTS

EP          2439746 A1   4/2012
WO    WO 2006/072094    7/2006

OTHER PUBLICATIONS

European Search Report dated Feb. 11, 2013 for EP 12186669.3.
(Continued)

Primary Examiner — Son Mai
(74) Attorney, Agent, or Firm — Knobbe, Martens, Olson & Bear LLP

(57) ABSTRACT

The disclosed technology relates to a non-volatile resistive memory device and a method of using the same. In one aspect, the memory device comprises a plurality of memory cells interconnected by a plurality of bit lines, a plurality of word lines, a plurality of source lines and a plurality of form lines. The memory device further comprises a memory controller connected to and configured to apply voltages to the bit lines, the word lines, the source lines and the form lines. In addition, each of the memory cells comprises a cell selecting transistor and a resistive memory element serially connected to a drain-source path of the cell selecting transistor. Furthermore, each of the memory cells comprises a boosting capacitor configured to provide a boosting a voltage to an internal node formed at a connection point between the resistive memory element and the cell selecting transistor.

19 Claims, 6 Drawing Sheets

(51) Int. Cl.
*G11C 11/16* (2006.01)
*H01L 45/00* (2006.01)

(56) References Cited

U.S. PATENT DOCUMENTS

| | | | | |
|---|---|---|---|---|
| 8,435,831 | B2* | 5/2013 | Sekar et al. | 438/104 |
| 2002/0018356 | A1* | 2/2002 | Hoffmann et al. | 365/145 |
| 2004/0100850 | A1* | 5/2004 | Novosel et al. | 365/225.7 |
| 2004/0130931 | A1 | 7/2004 | Izutsu | |
| 2009/0184350 | A1* | 7/2009 | Kodama et al. | 257/296 |
| 2009/0285041 | A1 | 11/2009 | Ito | |
| 2010/0290271 | A1* | 11/2010 | Lung | 365/163 |
| 2011/0080774 | A1 | 4/2011 | Saito | |

OTHER PUBLICATIONS

Walczyk, D., Resistive Switching Characteristics of CMOS Embedded HfO2-Based 1T1R Cells, Microelectronic Engineering, 2001, vol. 88, pp. 1133-1135.

Walczyk, D., on the Roll of Ti Adlayers for Resistive Switching in HfO2-Based Metal-Insulator-Metal Structures: Top Versus Bottom Electrode Integration, J.Vac. Sci Tehchnol., Jan./Feb. 2011, B29(1), pp. 01AD02-1-01AD02-7.

* cited by examiner

NON-VOLATILE RESISTIVE MEMORY DEVICES AND METHODS FOR BIASING RESISTIVE MEMORY STRUCTURES THEREOF

CROSS-REFERENCE TO RELATED APPLICATIONS

This application claims foreign priority to European patent application EP 12186669.3 filed on Sep. 28, 2012, the contents of which is incorporated by reference herein in its entirety.

BACKGROUND OF THE INVENTION

1. Field of the Invention

The disclosed technology relates to non-volatile resistive memory devices, such as for example RRAM, PCM, or other, and methods for biasing the resistive memory structures of such non-volatile resistive memory devices for electroforming, setting, writing/write-assisting and the like.

2. Description of the Related Technology

Non-volatile resistive memory, e.g. resistive random access memory (RRAM), interfacial switching memory, phase-change memory (PCM), or other, is emerging as a disruptive memory technology, implementing memory function in a resistance (rather than stored charge), the value of which can be changed by switching between a low and a high level. Although the phenomenon of reversible resistance switching has been studied since the 1960s, recent extensive research in the field has led to the proposition of several concepts and mechanisms through which this reversible change of the resistance state is possible. Many non-volatile resistive memory concepts, e.g. most RRAM, are based on a metal-insulator-metal (MIM) structure in which a conductive path is created or dissolved, corresponding to low-resistive and high-resistive states. This attribute is associated with a high scalability potential, beyond the limits currently predicted for flash memory. The MIM resistive memory structure is connected serially with e.g. an nMOS transistor, which acts as a cell selector.

A suitable insulating material for RRAM is for example a thin $HfO_2$ dielectric film. Sandwiched between two conducting electrodes, such a film exhibits resistive switching properties, which can be either "unipolar" switching or "bipolar" switching, depending on, for example, the materials used as electrodes and on the method used to deposit the active (oxide) film. As used herein, the term "bipolar" switching is used to describe a memory cell which switches from a high resistance state to a low resistance state under a first electrode polarity, while switching from a low resistance state to a high resistance state under a second electrode polarity that is opposite to the first polarity. In contrast, as used herein, the term "unipolar" switching is used to describe a memory cell which switches from a high resistance state to a low resistance state under one electrode polarity, while also switching from a low resistance state to a high resistance state under the same polarity. Without being bound to any particular theory of operation, the bipolar operation of $HfO_2$, requiring voltages of opposite polarity to switch on/off the cell, is believed to be due to the formation of conductive paths (filaments) associated with presence of oxygen vacancies (VO), which can be ruptured/restored through oxygen/VO migration under electric field and/or locally enhanced diffusion. The formation of the filament (forming, or electroforming) is believed to take place along pre-existing weak spots in the oxide, for instance along the grain boundaries in case of a polycrystalline $HfO_2$, which presumably have larger amount of defects and also a higher oxygen diffusivity compared to the bulk of the material. Other suitable insulating materials for this type of memory include $HfO_2$, zirconium dioxide, titanium dioxide, tantalum dioxide/ditantalum pentoxide.

For some biasing schemes applied to such non-volatile resistive memory devices, such as for example electroforming for a first formation of the resistive memory element, for example for writing/setting and erasing/resetting, a higher voltage may be m over the resistive memory element, above the supply voltage and/or above the transistor gate oxide breakdown voltage. The electroforming voltage, for example, is typically the highest voltage which is applied to the cell and is needed only once, to get the cells ready for operation. In contrast, the Set (on-switching) and Reset (off-switching) voltages are lower, but still a voltage above the supply voltage may be used.

SUMMARY OF CERTAIN INVENTIVE ASPECTS

In one aspect, the disclosed technology relates to a non-volatile resistive memory device in which a higher voltage can be applied over the resistive memory structures, above the supply voltage and/or above the transistor gate oxide breakdown voltage, without overstressing other components of the memory device.

It another aspect, the disclosed technology relates to a method for biasing the resistive memory structures of a non-volatile resistive memory device, such that a higher voltage above the supply voltage and/or above the transistor gate oxide breakdown voltage is applied over the resistive memory structures.

These aspects are achieved according to this disclosure by means of the subject-matter of the independent claims.

In a first aspect, this disclosure relates to a non-volatile resistive memory device comprising a plurality of memory cells and bit lines (BL), word lines (WL), source lines (SL) and form lines (FL) for addressing and setting/resetting the memory cells, each of said plurality of memory cells comprising: a cell selecting transistor; a resistive memory structure or element (RME) serially connected to a drain-source path of the cell selecting transistor, the resistive memory structure and the cell selecting transistor together forming a conductive path between one of said bit lines and one of said source lines and the gate of the cell selecting transistor being connected to one of said word lines; and a boosting capacitor connected between one of said form lines and an internal node of the memory cell at a connection between the resistive memory structure and the cell selecting transistor, said boosting capacitor being configured for boosting a supply voltage applied to said form line to a forming voltage on said internal node, suitable for electroforming said resistive memory structure.

This disclosure is generally applicable to any non-volatile resistive memory, in particular any memory wherein the memory cells comprise a single cell selecting transistor+a 2-terminal memory element, which includes oxide RRAM, conductive bridging RRAM, STT-MRAM, PCM and others.

Comparing this disclosure to for example prior art resistive RAM, an additional capacitance is added to the cell, namely the boosting capacitor. One terminal connects to the node between the transistor source/drain and the memory element. The other terminal is connected to an additional address line, the form line. This structure, together with a particular biasing scheme using the form line, an example of which is described herein, may allow to apply up to 2× higher voltage to the memory element than to the transistor gate oxide. As a result, electroforming can be performed without overstressing the transistor gate oxide.

The biasing scheme for electroforming may for example be the following. In a first phase, SL is kept at Vss (e.g. 0V), BL is kept at Vdd, WL is kept at Vdd and FL is kept at Vss. As the unformed RME acts as a capacitor (no current flows through it), the internal node charges to Vdd because of a transistor drain-source sub-threshold current. However, as the transistor is biased in the sub-threshold region, the internal node can be considered "floating" when applying fast signals. In a second phase, the FL is driven from Vss (e.g. 0V), to Vdd. The internal node is coupled to this FL through the boosting capacitor, and hence the voltage on the "floating" internal node increases. This way, the voltage over the RME can be increased, while the voltage over the transistor gate oxide can remain within specifications.

In embodiments according to the present disclosure, for each of said plurality of memory cells the resistive memory structure can be provided in the conductive path between said internal node and said source line, i.e. the internal node is connected to the transistor drain. Such a cell layout has the advantages of having a limited capacitance on the BL (BL signal is the one used of reading the cell), providing the best trade-off between achievable bias conditions for forming and set vs. reset.

In embodiments according to the present disclosure, for each of said plurality of memory cells the boosting capacitor may comprise a dielectric in the same material as the resistive memory structure. The device may comprise a patterned layer of said material, wherein for each of said plurality of memory cells the dielectric of the boosting capacitor and the resistive memory structure may be formed by separated parts of the patterned layer. In such embodiments, the form lines and the word lines may be formed in different layers above each other.

In embodiments according to the present disclosure, for each of said plurality of memory cells the boosting capacitor may comprise a dielectric in the same material as the gate dielectric of the cell selecting transistor. The device may comprise a patterned layer of said material, wherein for each of said plurality of memory cells the dielectric of the boosting capacitor and the gate dielectric may be formed by separated parts of the patterned layer. In such embodiments, the form lines and the word lines may be formed by separated parts of the same patterned layer.

In embodiments according to the present disclosure, the resistive memory structure may comprise a dielectric layer of a Group IV or Group V transition metal oxide. The transition metal oxide may be chosen from the group of $HfO_2$, $ZrO_2$, $TiO_2$, $TaO_2$, $Ta_2O_5$.

In embodiments according to the present disclosure, the dielectric layer may be single crystalline or polycrystalline.

In embodiments according to the present disclosure, the thickness of the dielectric layer may lie in the range between 1 and 10 nm.

In embodiments according to the present disclosure, the device may comprise a memory controller for applying voltages to said bit lines, word lines, source lines and form lines, said memory controller being arranged for performing an electroforming procedure in which in a first phase a supply voltage is applied to said bit and word lines and a ground voltage is applied to said form and source lines for a predetermined period, such that said boosting capacitors are charged by sub-threshold leakage current through said cell selecting transistors, and in a second phase the voltage on said form lines is driven to said supply voltage while maintaining the voltages on the bit, word and source lines, such that charge on said boosting capacitors boosts the voltage on said internal nodes to said forming voltage suitable for electroforming said resistive memory structure.

In a second aspect, the present disclosure relates to a method for biasing resistive memory structures of a non-volatile resistive memory device, said non-volatile memory device comprising a plurality of memory cells and bit lines (BL), word lines (WL), source lines (SL) and form lines (FL) for addressing and setting/resetting the memory cells, each of said plurality of memory cells comprising: a cell selecting transistor (T); a resistive memory structure (RME) serially connected to a drain-source path of the cell selecting transistor, the resistive memory structure and the cell selecting transistor together forming a conductive path between one of said bit lines (BL) and one of said source lines (SL) and the gate of the cell selecting transistor being connected to one of said word lines (WL); and a boosting capacitor (CB) connected between one of said form lines (FL) and an internal node (N) of the memory cell at a connection between the resistive memory structure and the cell selecting transistor; the method comprising the step of boosting a voltage on said internal node of at least one of said cells by means of said boosting capacitor of the cell.

In embodiments according to the second aspect, the boosting step can be performed in an electroforming, writing or resetting procedure as described elsewhere herein.

BRIEF DESCRIPTION OF THE DRAWINGS

The disclosure will be further elucidated by means of the following description and the appended figures.

DETAILED DESCRIPTION OF CERTAIN ILLUSTRATIVE EMBODIMENTS

Figure 1:
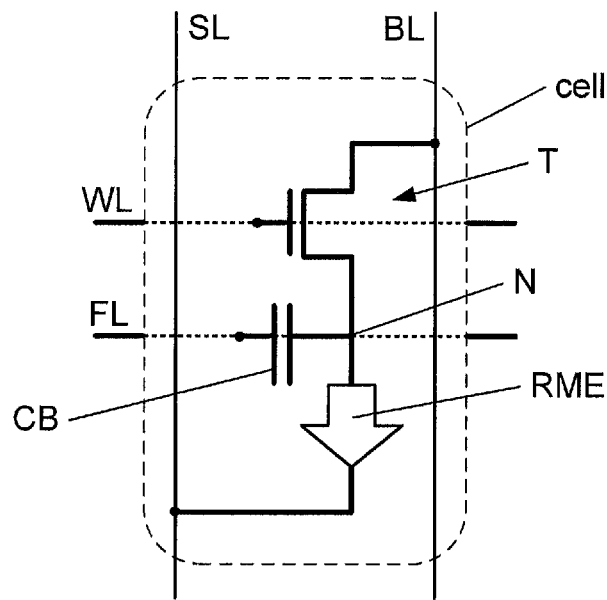
FIG. 1 shows a schematic circuit illustration of a non-volatile memory cell including a boosting capacitor according to an embodiment.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

Forming

Oxide-type resistive RAM (RRAM) stacks, such as $HfO_x$ stacks, are typically formed at high voltage (e.g. 2V) before they can be used. Under many circumstances, sub-100 nm design rule transistors cannot withstand these voltages. This poses a challenge for the use of $HfO_x$ RRAM as SRAM replacement and as embedded flash replacement.

FIG. 1 shows a circuit diagram of a possible implementation of a boosting capacitor in a non-volatile resistive memory device according to the disclosure comprising a memory cell with a single transistor and a single resistive memory structure.

With reference to FIG. 1, a memory cell of the memory device is shown with bit lines BL, word lines WL, source lines SL and form lines FL for addressing and setting/resetting the memory cell. The memory cell comprises a resistive memory structure RME serially connected to a cell selecting transistor T. The resistive memory structure and the cell selecting transistor are connected between one of the bit lines BL and one of the source lines SL. The gate of the cell selecting transistor is connected to one of the word lines WL and an internal node N of the memory cell, at a connection between the resistive memory structure RME and the cell selecting transistor, is connected to one of the form lines FL via a boosting capacitor CB. The boosting capacitor is configured for boosting a supply voltage applied to the form line to a forming voltage on the internal node N, suitable for electroforming the resistive memory structure RME.

Figure 2:
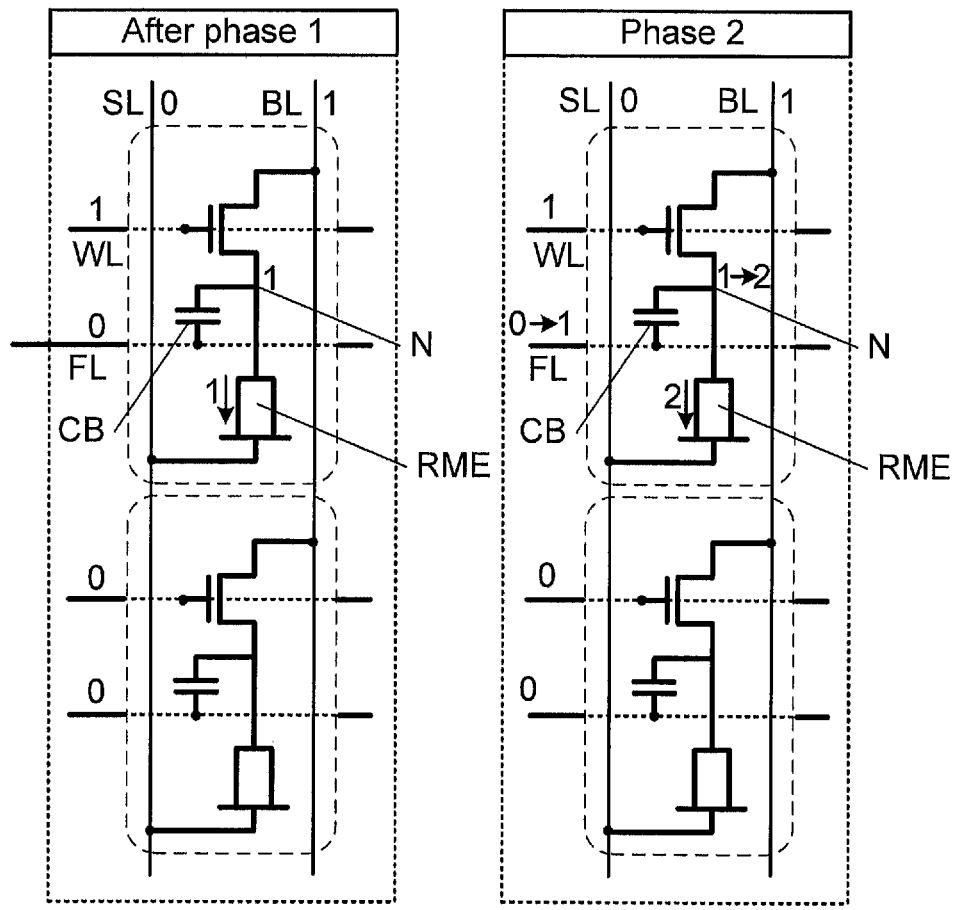
FIG. 2 shows a circuit illustration of biasing schemes in an electroforming procedure of a non-volatile resistive memory device according to an embodiment.

With reference to FIG. 2, an example of a biasing scheme for performing the electroforming procedure is shown. The forming of the RME in the non-volatile resistive memory device is performed as follows. In a first phase, the source line is kept at 0V, the bit line is kept at 1V and the form line is kept at 0V. As the unformed resistive memory structure (here, a layer of $HfO_2$) acts as a capacitor (no current flows through it), the internal node N charges to 1V because of the transistor drain-source sub-threshold current. However, as the transistor is biased in the sub-threshold region, the internal node can be considered "floating" when applying fast signals. In the second phase, the form line is driven from 0V to 1V. The internal node N is coupled to this form line, and hence the voltage on the "floating" internal node increases. This increases the voltage over the resistive memory structure. The transistor is still in cut-off mode so that the charge is trapped on the internal mode. This results in a stress of about 2V over the resistive memory structure and maximum 1V over the transistor. The 2V stress over the resistive memory structure allows the forming of the resistive memory structure from the $HfO_2$ layer.

Figure 3:
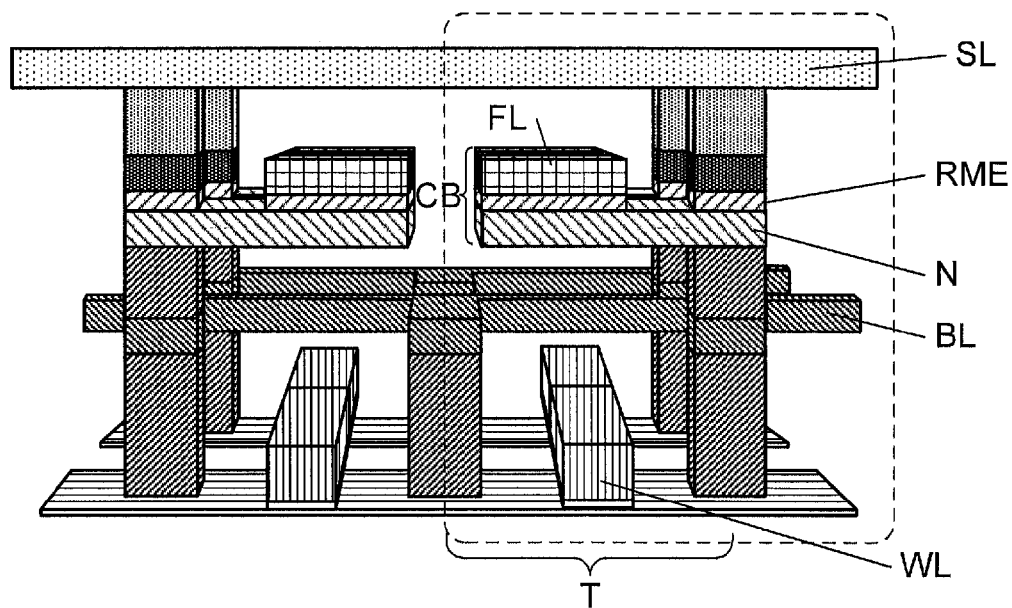
FIGS. 3-5 show perspective views of a first embodiment of a non-volatile resistive memory device.
Figure 4:
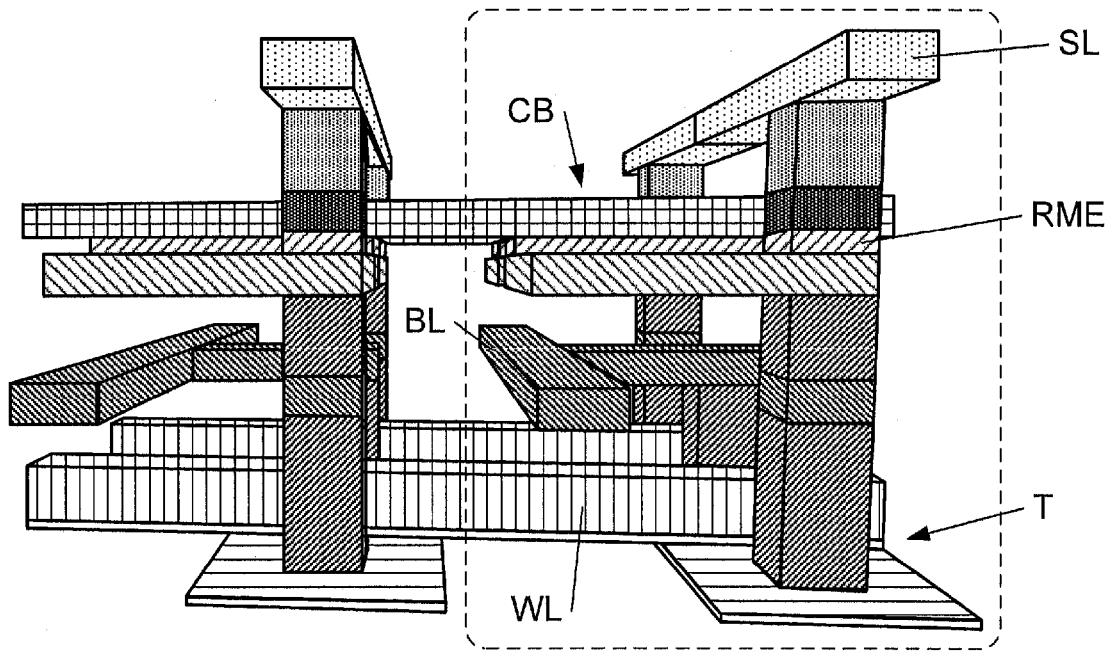
Figure 5:
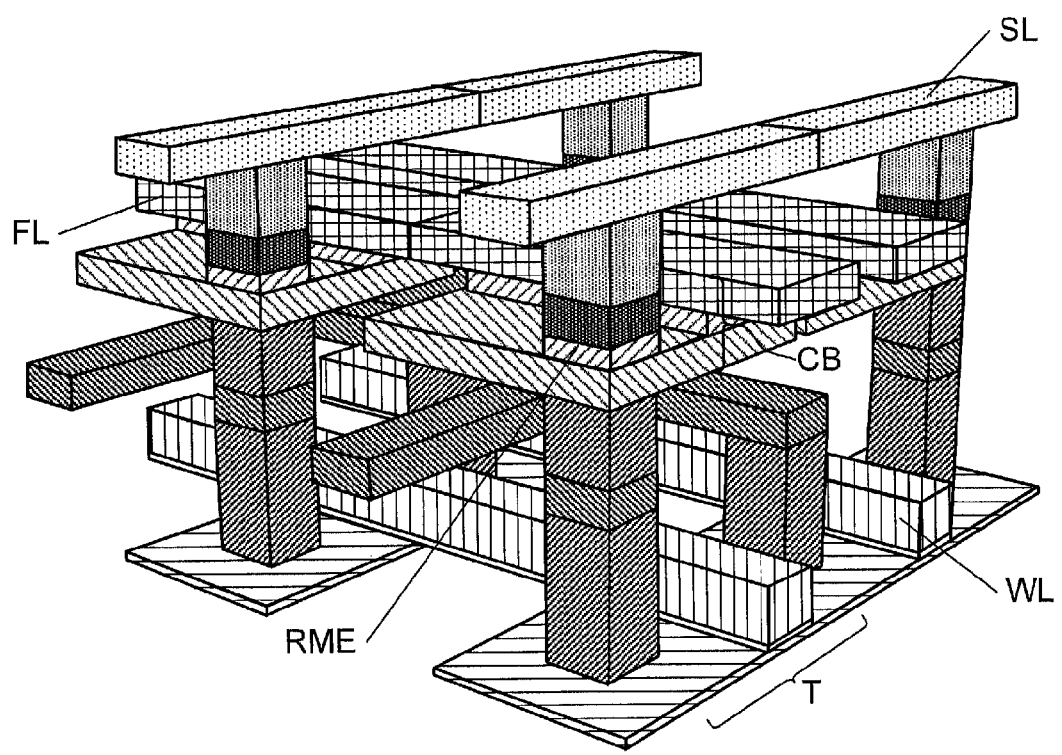

A first practical implementation of a non-volatile resistive memory device according to this disclosure is shown in FIGS. 3-5. The memory device in FIGS. 3-5 comprises an array of sequentially stacked layers of different materials on a substrate, forming the features represented in FIG. 1. Parallel to the substrate, the bit lines BL and the source lines SL run parallel to each other and run perpendicular to the word lines WL and the form lines FL. The bit and source lines run at different levels and are not in direct electrical contact with each other. The cell selecting transistor T extends vertically with respect to the substrate. The boosting capacitor CB is formed by the overlap between the form line FL and the underlying conductive layer, through which the boosting capacitor is connected to the internal node N. Here, a layer of $HfO_2$ is used both for the resistive memory structure and for the boosting capacitor CB. This way, the capacitor fits well within the resistive memory device and does not add any area overhead. Furthermore, the boosting capacitor dielectric can be deposited in the same processing step as the resistive memory structure, which can simplify the manufacturing process.

Figure 6:
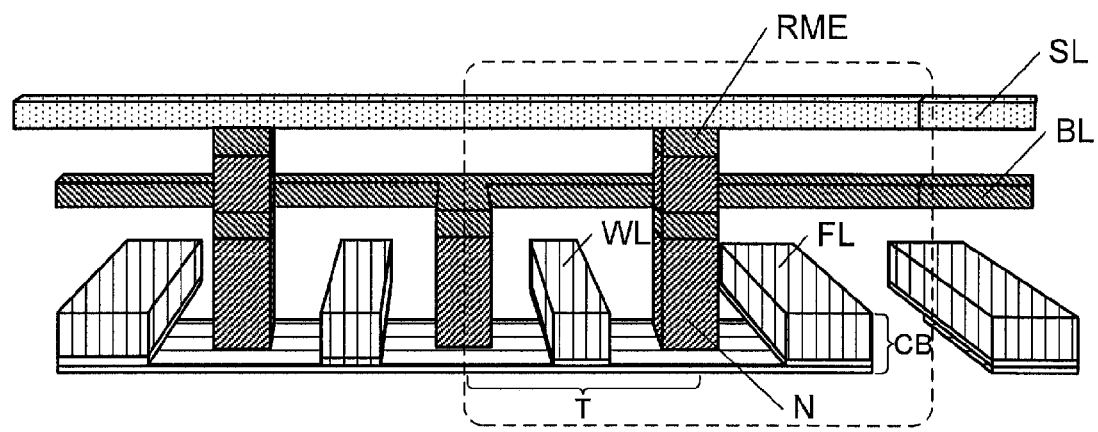
FIGS. 6-7 show perspective views of a second embodiment of a non-volatile resistive memory device.
Figure 7:
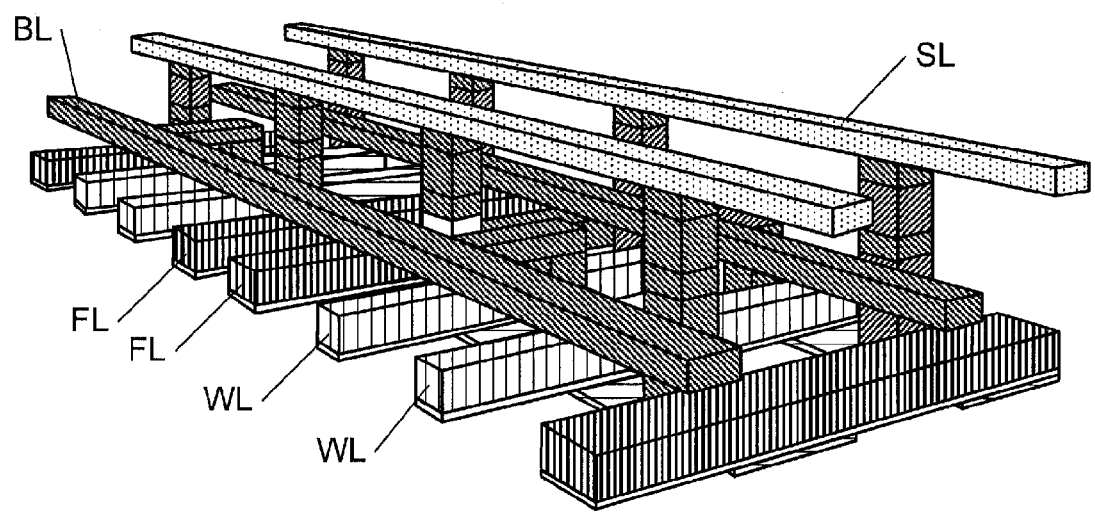

A second practical implementation of a non-volatile resistive memory device according to this disclosure is shown in FIGS. 6-7. The memory device in FIGS. 6-7 comprises an array of sequentially stacked layers of different materials on a substrate, forming the features represented in FIG. 1. Parallel to the substrate, the bit lines BL and the source lines SL run parallel to each other and run perpendicular to the word lines WL and the form lines FL. The bit and source lines run at different levels and are not in direct electrical contact with each other. The cell selecting transistor T extends vertically with respect to the substrate. Here, an additional (pseudo) transistor structure, namely a gate oxide with an address line FL, is added to the cell to implement the boosting capacitor CB. In particular, the boosting capacitor has a dielectric in the same layer as the gate dielectric of the cell selecting transistor and the form lines FL are interleaved in pairs with the word lines WL.

As illustrated in the Figures, the bit lines and the source lines may run parallel to each other and may run perpendicular to the word lines and the form lines, but this is not essential. The composition of the bit lines, word lines, source lines and form lines may vary according to the environment in which the disclosure is applied. According to certain embodiments of the disclosure, the bit lines, word lines, source lines and form lines may comprise combinations of conductors, including metals like copper, aluminum, tungsten and titanium and alloys and combinations thereof, p-type and n-type polysilicon, p-type and n-type diffusion regions, metal silicides, semimetals and the like. The cell selecting transistor comprises for example a metal oxide semiconductor. The resistive memory structure comprises preferably a dielectric layer of a Group IV or Group V transition metal oxide, typical examples of suitable oxides are $HfO_2$, $ZrO_2$, $TiO_2$, $TaO_2$, and Ta2O5. The oxides may be sub-stoichiometric. Such oxide layers may be formed for example by ALD, CVD, PVD or any other deposition technique suitable for depositing transition metal oxide layers and which is compatible with standard CMOS manufacturing techniques. The resistive memory structure may comprise single crystalline or polycrystalline materials. The boosting capacitor preferably comprises a dielectric layer, for example comprising a layer of substantially the same material as the resistive memory structure.

Other examples of suitable dielectric materials are $Al_2O_3$, $CeO_2$, $HfSi_xO_x$, $HfAlO_x$, and $La2O3$.

Write and Reset

Emerging memories such as typical RRAM stacks and spin transfer torque magnetic RAM (STT-MRAM) magnetic tunnel junctions (MTJ) may typically use relatively high currents for set and reset. In a cell configuration with only one transistor, either set or reset current must be delivered by a transistor whose gate-to-source voltage (VGS) is reduced by the set or reset voltage of the memory element. This drastically reduces the current drive of the transistor.

Using an implementation of a non-volatile memory structure according to this disclosure, for both setting and resetting in a cell configuration with only one transistor, one of two approaches may be used. One of the two approaches may be advantageous over the other, depending on the circumstance, as illustrated in FIGS. 8 and 9.

In the first approach, the form line runs parallel with the word line. In the set phase, the voltage on the form line is driven to the supply voltage while the cell columns in which the cell should not be set will be biased at the voltages on the bit line, which is equal to the voltages on the source line. In the reset phase, the voltage on the form line is driven to the ground voltage while the cell columns in which the cell should not be reset will be biased at the voltage on the bit line, which is equal to the voltages on the source line.

Figure 8:
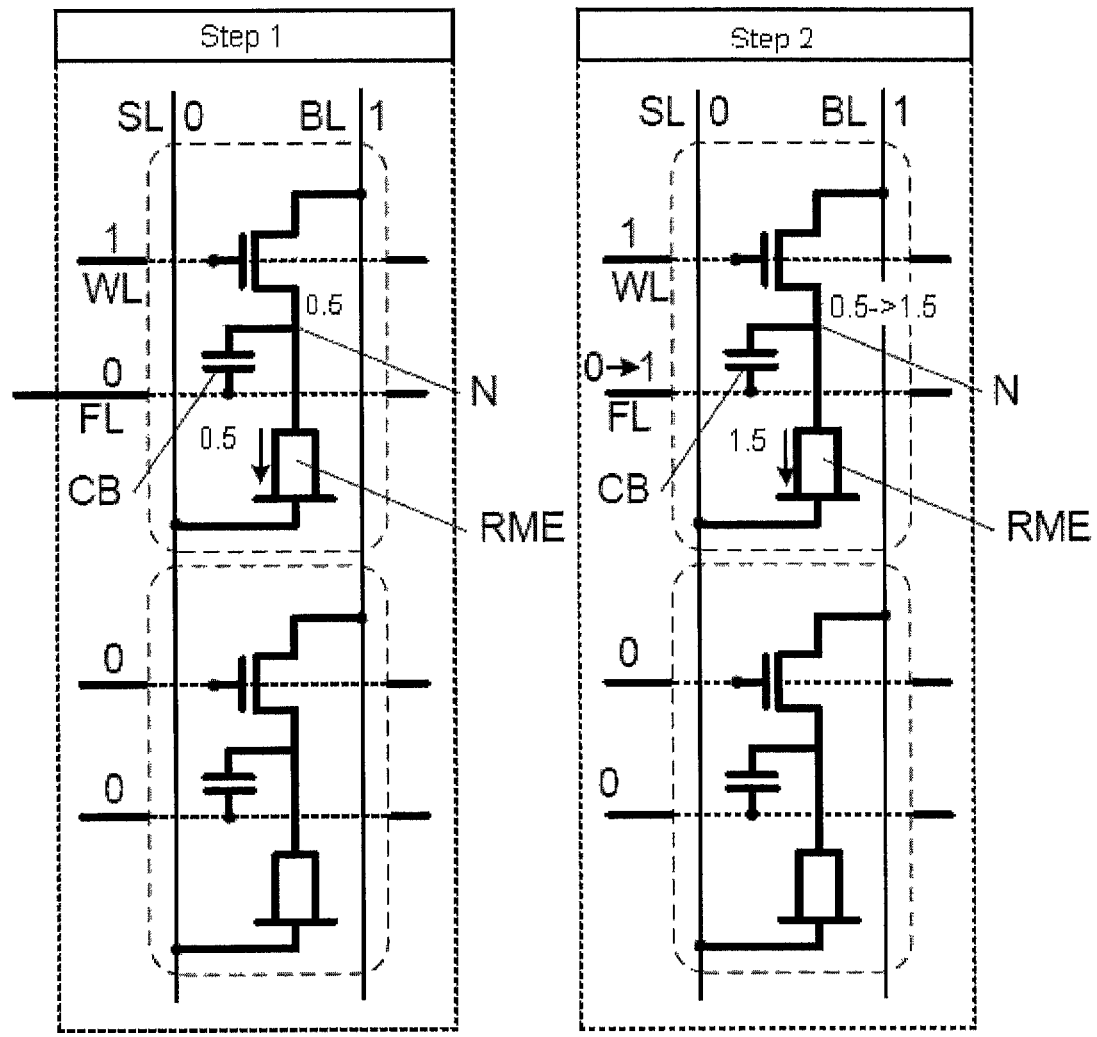
FIGS. 8-9 show a circuit illustration of set and reset procedures of a non-volatile resistive memory device according an embodiment.

FIG. 8 shows an illustration of the set procedure where in a first step the source line is kept at 0V, the bit line is kept at 1V and the form line is kept at 0V, the internal node N is charged to 0.5V and the voltage over the resistive memory structure is 0.5V, noting that this voltage should preferably be as high as possible. In the second step, the form line is driven from 0V to 1V. The internal node N is coupled to this form line, and hence the voltage on the internal node increases to 1.5V. The voltage over the resistive memory structure increases accordingly to 1.5V.

Figure 9:
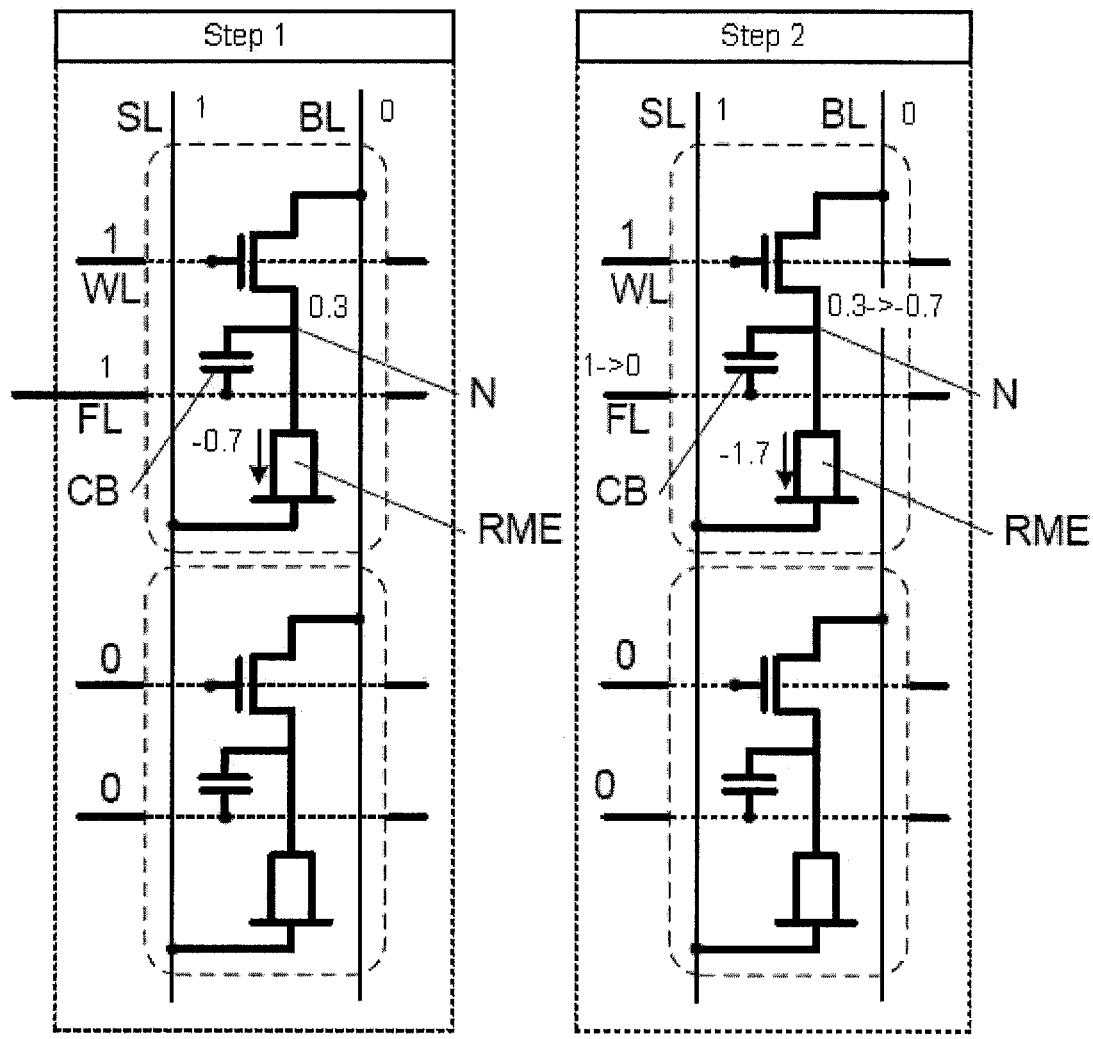

FIG. 9 shows an illustration of the reset procedure where in a first step the source line is kept at 1V, the bit line is kept at 0V and the form line is kept at 1V, the internal node N is charged to 0.3V and the voltage over the resistive memory structure is −0.7V, noting that this voltage should preferably be as negative as possible. In the second step, the form line is driven from 1V to 0V. The internal node N is coupled to this form line, and hence the voltage on the internal node decreases to −0.7V. The voltage over the resistive memory structure decreases to −1.7V.

In the second approach, the form lines run parallel with the bit lines. For columns in which the cell must be set, the form line is driven to the supply voltage and for columns in which the cell must be set, the form line is driven to the ground voltage.

What is claimed is:

1. A non-volatile resistive memory device, comprising:
   a plurality of memory cells interconnected by a plurality of bit lines, a plurality of word lines, a plurality of source lines and a plurality of form lines;
   a memory controller connected to and configured to apply voltages to the bit lines, the word lines, the source lines and the form lines,
   wherein each of the memory cells comprises:
      a cell selecting transistor having a source, a drain and a gate;
      a resistive memory element serially connected to a drain-source path of the cell selecting transistor,
      wherein the resistive memory element and the cell selecting transistor are configured to form a conductive path between one of the bit lines and one of the source lines, and
      wherein the gate of the cell selecting transistor is connected to one of the word lines; and
   a boosting capacitor having a first electrode and a second electrode,
      wherein the first electrode of the boosting capacitor is connected to one of the form lines,
      wherein the second electrode of the boosting capacitor is connected to an internal node of each of the memory cells, the internal node formed at a connection point between the resistive memory element and the cell selecting transistor,
      wherein the boosting capacitor is configured to supply a boosting voltage to the internal node, and
      wherein a dielectric material of the boosting capacitor and a dielectric material of the resistive memory element are formed of the same dielectric material.

2. The non-volatile resistive memory device of claim 1, wherein the resistive memory element is provided in the conductive path between the internal node and the source line.

3. The non-volatile resistive memory device of claim 1, further comprising a patterned layer of the same dielectric material, wherein the boosting capacitor and the resistive memory element are formed on different portions of the patterned layer, wherein the different portions are separated from one another.

4. The non-volatile resistive memory device of claim 3, wherein the form lines and the word lines are formed in different layers above each other.

5. The non-volatile resistive memory device of claim 1, wherein the boosting capacitor and the gate of the cell selecting transistor are formed from a same dielectric material.

6. The non-volatile resistive memory device of claim 5, further comprising a patterned layer of the same dielectric material, wherein the boosting capacitor and the gate are formed on different portions of the patterned layer, wherein the different portions are separated from one another.

7. The non-volatile resistive memory device of claim 6, wherein the form lines and the word lines are formed by separated parts of the same patterned layer.

8. The non-volatile resistive memory device of claim 1, wherein the memory controller is configured to perform an electroforming procedure, the electroforming procedure comprising:
   a first phase, during which a supply voltage is applied to the bit and word lines and a ground voltage is applied to the form and source lines for a predetermined period, such that the boosting capacitor are charged by a sub-threshold leakage current through the cell selecting transistor; and
   a second phase, during which the voltage on the form lines is driven to the supply voltage while maintaining the voltages on the bit, word and source lines, such that charge on the boosting capacitors boosts the voltage on the internal nodes to a forming voltage suitable for electroforming the resistive memory element.

9. A non-volatile resistive memory device, comprising:
   a plurality of memory cells interconnected by a plurality of bit lines, a plurality of word lines, a plurality of source lines and a plurality of form lines, wherein each of the memory cells comprises:

a cell selecting transistor having a source, a drain and a gate;

a resistive memory element serially connected to a drain-source path of the cell selecting transistor, wherein the resistive memory element is a reversible resistance switching element, wherein the resistive memory element and the cell selecting transistor are configured to form a conductive path between one of the bit lines and one of the source lines, and wherein the gate of the cell selecting transistor is connected to one of the word lines;

a boosting capacitor having a first electrode and a second electrode, wherein the first electrode of the boosting capacitor is connected to one of the form lines, wherein the second electrode of the boosting capacitor is connected to an internal node of each of the memory cells, the internal node formed at a connection point between the resistive memory element and the cell selecting transistor, and wherein the boosting capacitor is configured to supply a boosting voltage to the internal node; and a memory controller connected to and configured to apply voltages to the bit lines, the word lines, the source lines and the form lines, wherein the memory controller is configured to perform a write procedure, the write procedure comprising:

a first phase, during which a supply voltage is applied to the bit and word lines and a ground voltage is applied to the form and source lines of one or more of the memory cells for a predetermined period, such that the boosting capacitor is charged by a current through the cell selecting transistor; and a second phase, during which the voltage on the form line is driven to a voltage above the ground voltage while maintaining the voltages on the bit, word and source lines, such that charge on the boosting capacitor boosts the voltage on the internal node to a write-assist voltage to assist in setting the resistive memory element.

10. A non-volatile resistive memory device, comprising:

a plurality of memory cells interconnected by a plurality of bit lines, a plurality of word lines, a plurality of source lines and a plurality of form lines, wherein each of the memory cells comprises:

a cell selecting transistor having a source, a drain and a gate;

a resistive memory element serially connected to a drain-source path of the cell selecting transistor, wherein the resistive memory element is a reversible resistance switching element, wherein the resistive memory element and the cell selecting transistor are configured to form a conductive path between one of the bit lines and one of the source lines, and wherein the gate of the cell selecting transistor is connected to one of the word lines;

a boosting capacitor having a first electrode and a second electrode, wherein the first electrode of the boosting capacitor is connected to one of the form lines, wherein the second electrode of the boosting capacitor is connected to an internal node of each of the memory cells, the internal node formed at a connection point between the resistive memory element and the cell selecting transistor, and wherein the boosting capacitor is configured to supply a boosting voltage to the internal node; and a memory controller connected to and configured to apply voltages to the bit lines, the word lines, the source lines and the form lines, wherein the memory controller is configured to perform a reset procedure, the reset procedure comprising:

a first phase, during which a supply voltage is applied to the word lines, source lines and form lines and a ground voltage is applied to the bit lines of one or more of the memory cells for a predetermined period, such that the boosting capacitor of the cell is charged by a current through the cell selecting transistor; and a second phase, during which the voltage on the form line is driven to the ground voltage while maintaining the voltages on the word and source lines, such that charge on the boosting capacitor boosts the voltage on the internal node to a reset voltage to assist in resetting the resistive memory element.

11. The non-volatile resistive memory device of claim 1, wherein the resistive memory element comprises a bipolar switching memory element.

12. The non-volatile resistive memory device of claim 1, wherein the resistive memory element is formed of a transition metal oxide of a metal chosen from one of a Group IV metal and a Group V metal.

13. The non-volatile resistive memory device of claim 12, wherein the transition metal oxide has a thickness between about 1 nm and 10 nm.

14. A method for biasing a resistive memory element of a non-volatile resistive memory device, the non-volatile memory device comprising a plurality of memory cells interconnected by bit lines, word lines, source lines and form lines, the method comprising:

placing an internal node of a memory cell at first internal node voltage by charging a boosting capacitor connected to the internal node, wherein the internal node is formed at a connection point between the boosting capacitor, a resistive memory element, and a cell selecting transistor, wherein the boosting capacitor comprises a first electrode connected to a form line, and wherein the boosting capacitor comprises a second electrode connected to the internal node; and boosting the voltage of the internal node to a second internal node voltage higher than the first internal node voltage by changing the voltage of the form line.

15. The method of claim 14, wherein boosting is applied in performing an electroforming procedure, the electroforming procedure comprising:

a first phase, during which a supply voltage is applied to a bit line connected to a drain of the cell selecting transistor and to a word line connected to a gate of the cell selecting transistor, and during which a ground voltage is applied to the form line and a source line connected to the source of the cell selecting transistor, such that the boosting capacitor is charged by sub-threshold leakage current through the cell selecting transistor; and a second phase, during which the voltage on the form line is driven to the supply voltage while maintaining the voltages on the bit, word and source lines, such that charge on the boosting capacitor boosts the voltage on the internal node to a forming voltage suitable for electroforming the resistive memory element.

16. The method of claim 14, wherein the boosting step is applied in performing a write procedure, the write procedure comprising:

a first phase, during which a supply voltage is applied to a bit line connected to a drain of the cell selecting transistor and to a word line connected to a gate of the cell selecting transistor, and during which a ground voltage is applied to the form and a source line connected to a source of the cell selecting transistor, such that the boosting capacitor is charged by the current through the cell selecting transistor; and a second phase, during which the voltage on the form line is driven to the supply voltage while maintaining the voltages on the bit, word and source lines, such that charge on the boosting capacitor boosts the voltage on the internal node to a setting voltage suitable for setting the resistive memory element.

17. The method of claim 14, wherein the boosting step is applied in performing a reset procedure, the reset procedure comprising:

a first phase, during which a supply voltage is applied to a word line connected to a gate of the cell selecting transistor, a source line connected to a source of the selecting transistor, and the form line, and during which a ground voltage is applied to a bit line connected to a drain of the cell selecting transistor, such that the boosting capacitor is charged by the current through the cell selecting transistor; and a second phase, during which the voltage on the form line is driven to the ground voltage while maintaining the voltages on the word and source lines, such that charge on the boosting capacitor boosts the voltage on the internal node to a reset voltage to assist in resetting the resistive memory element.

18. The non-volatile resistive memory device of claim 1, wherein the resistive memory element is a reversible resistance switching element chosen from the group consisting of a resistive random access memory (RRAM) element, a phase change memory (PCM) element and a spin-transfer torque magnetic random access memory (STT-MRAM) element.

19. The non-volatile resistive memory device of claim 18, wherein the resistive memory element is a resistive random access memory (RRAM) element comprising a transition metal oxide.

* * * * *